United States Patent [19]
Moe et al.

[11] Patent Number: 4,898,639
[45] Date of Patent: Feb. 6, 1990

[54] WAFER RETENTION DEVICE

[75] Inventors: Rolf Moe, Alameda; David J. Correia, Hayward; Michael Downs, San Jose, all of Calif.

[73] Assignee: Bjorne Enterprises, Inc., Fremont, Calif.

[21] Appl. No.: 338,056

[22] Filed: Apr. 14, 1989

[51] Int. Cl.$^4$ .................. B44C 1/22; C03C 15/00; C03C 25/06
[52] U.S. Cl. .................. 156/345; 156/655; 156/668
[58] Field of Search ............ 156/345, 655, 662, 668; 134/153, 154, 157, 140, 160, 164; 204/298; 118/728; 269/55, 56, 237, 287, 900

[56] References Cited

U.S. PATENT DOCUMENTS

| | | | |
|---|---|---|---|
| 4,473,455 | 9/1984 | Dean et al. | 204/298 |
| 4,717,461 | 1/1988 | Strahl et al. | 156/643 X |
| 4,788,994 | 12/1988 | Shinbara | 134/157 |

*Primary Examiner*—William A. Powell
*Attorney, Agent, or Firm*—Julian Caplan

[57] ABSTRACT

A wafer retention arrangement is disclosed for use with wafer stripping machines and the like which include a housing and a turret rotatably coupled to the housing for rotation about a selected axis, the turret being formed with a plurality of pockets that are adapted to retain a wafer. The wafer retention arrangement for each pocket includes a plurality of clips disposed about the periphery of the pocket to support a retained wafer. A latching mechanism cooperates with the support means to hold the wafer within the pocket. The latching mechanism is pivotally mounted to the turret for rotation about an axis that is substantially parallel to the surface of a wafer held within its associated pocket. The pivot point about which the latch mechanism rotates is substantially adjacent the edge of the wafer but spaced apart from the wafer plane. The latch mechanism includes a cam follower portion for engaging the actuator, a wafer engaging portion for pressing against the side of a wafer carried by the associated pocket, and biasing means for urging the cam follower towards the engagement position. The clips and the latching mechanism cooperate to hold wafers of various sizes. An actuator mechanisms carried by the housing is arranged to independently pivot the latching arrangement from an engagement position suitable for contacting a wafer carried by its associated pocket to a disengaged position free from contacting the wafer.

9 Claims, 3 Drawing Sheets

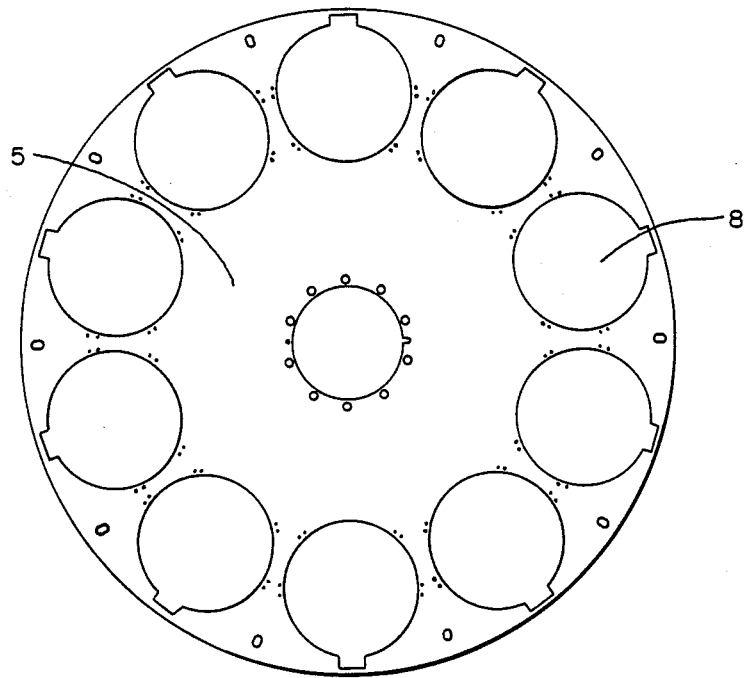
FIG.—1
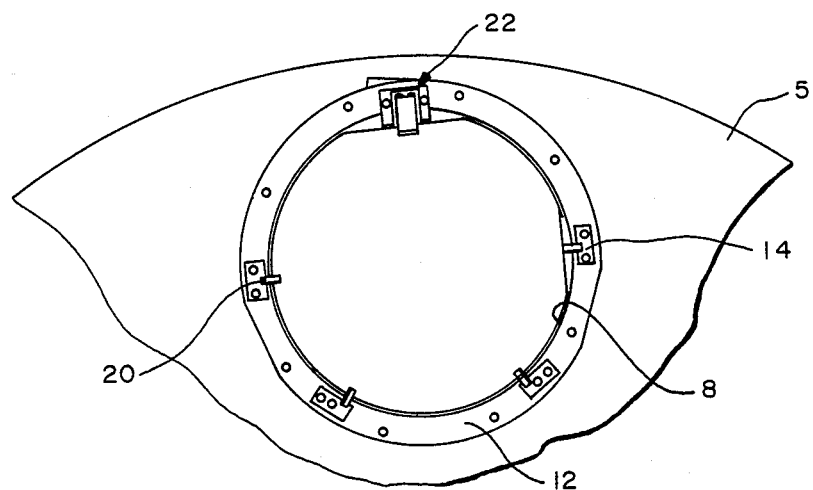
FIG.—2

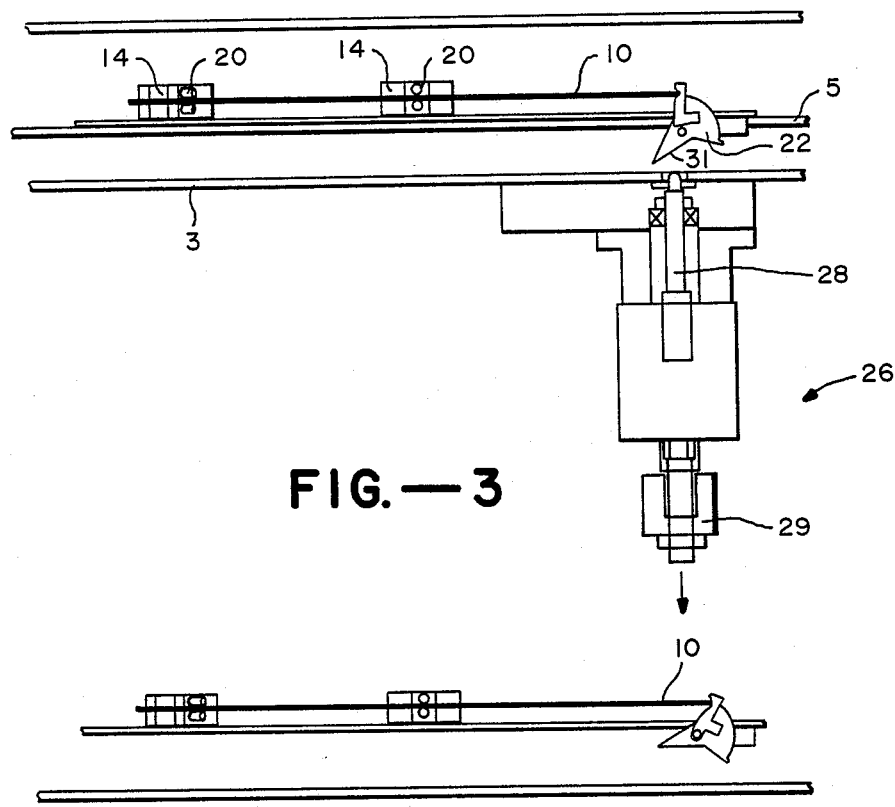
FIG.—3
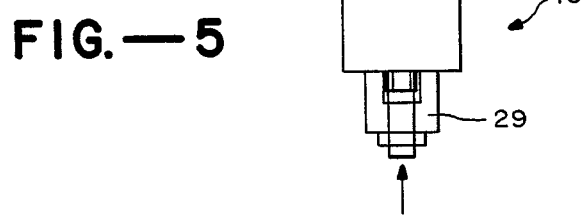
FIG.—4
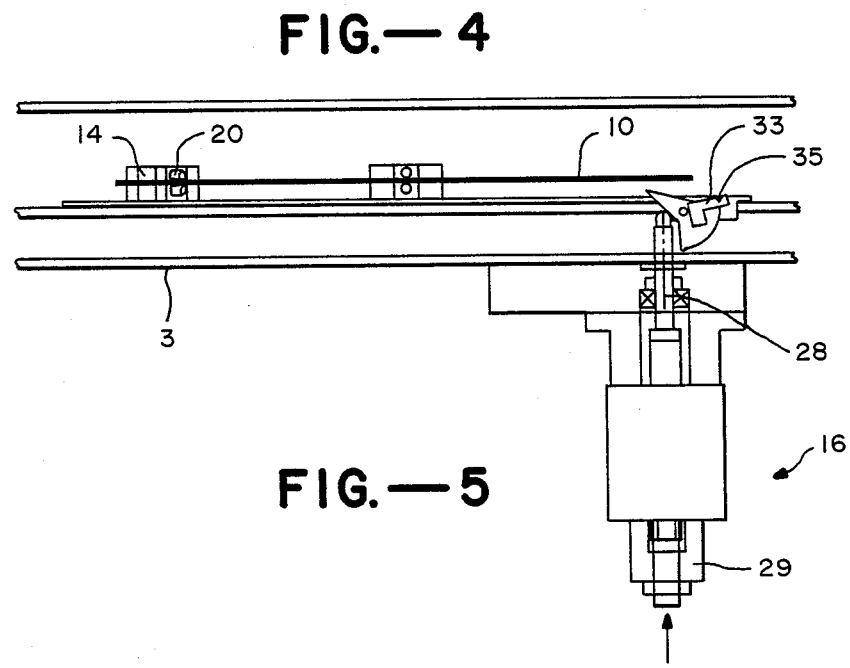
FIG.—5

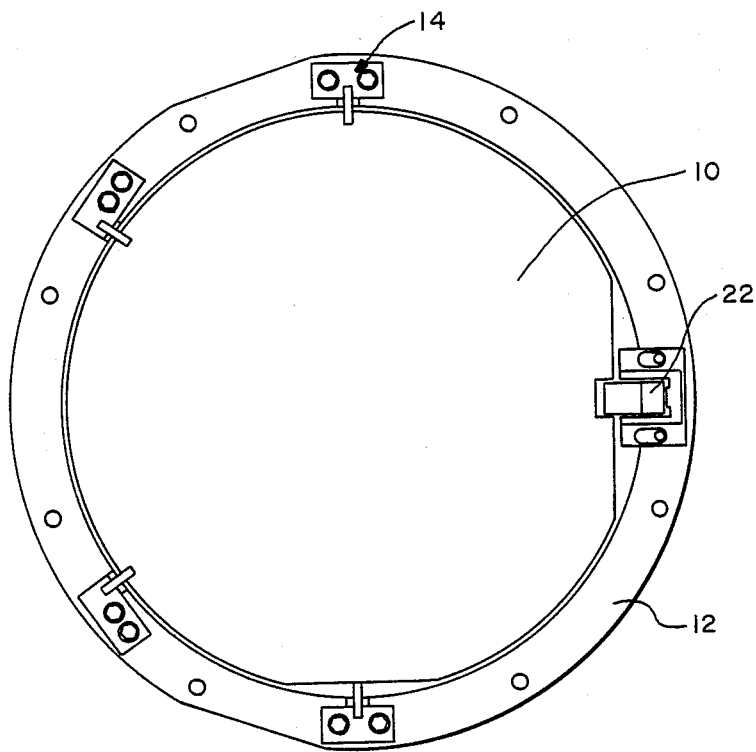
FIG.—6

WAFER RETENTION DEVICE

The present invention relates generally to an improved wafer retention device particularly suited for use with machines for stripping wafers.

BACKGROUND OF THE INVENTION

The application cited above discloses an improved machine for stripping baked photoresist from wafers used in the production of integrated circuit chips. The stripping machine individually lifts each wafer from a boat and deposits it in each of a series of vertically disposed turrets. The turrets are intermittently rotated. A first turret immerses the wafer in stripper solvent and another rinses the wafer. At times the system is arranged to immerse the wafer in other solutions as well. After the stripping process is completed, the rinsed and dried wafer is deposited on a boat for transportation to other processing facilities. To facilitate these operations, the turret has a plurality of circular openings adapted to receive a wafer. Since the turret is vertically disposed and the surface of the wafer must be exposed to facilitate stripping, rinsing and drying, the mechanism used to hold the wafer in place should contact a relatively small segment of the wafer yet firmly secure the wafer to the turret. Since the sizes of the wafers used typically varies, it is desirable to have the latching mechanism suited to accommodate such variations.

In the stripping machine disclosed in the application referenced above, a plurality of holders are attached to the rim of a pocket within the turret. The holders are shaped to receive a part of the edge of a wafer when the wafer is inserted into a pocket through an opening in the housing. A cam detent is attached to the rim adjacent the periphery of the turret. A trunnion supports the detent via a pivot. One end of detent is formed with a cam follower. A return spring biases the detent to keep it in operative engagement with the wafer. A retractable actuator is provided adjacent the housing opening. When the actuator is extended, it engages the follower on the pocket located adjacent the housing opening, pivoting the detent against the forces of the return spring and out of its operative position. This allows wafers to be inserted into and/or withdrawn from the pockets using various mechanisms.

SUMMARY OF THE INVENTION

Accordingly, it is a primary objective of the present invention to provide a wafer retention arrangement suitable for holding wafers in a vertically oriented turret.

Another objective is to provide a wafer retention arrangement capable of receiving different sized wafers.

Another objective is to provide a wafer retention device that is easy to fabricate and has relatively few mechanical parts.

To achieve the foregoing and other objects and in accordance with the purpose of the present invention, a wafer retention arrangement is provided for use with wafer stripping machines and the like. The wafer stripping arrangement includes a housing and a turret rotatably coupled to the housing for rotation about a selected axis, the turret being formed with a plurality of pockets that are adapted to retain a wafer. The wafer retention arrangement for each pocket includes support means disposed about the periphery of the pocket to support a retained wafer. A latching arrangement cooperates with the support means to hold the wafer within the pocket. The stripping device is provided with one or more actuator mechanisms arranged to independently pivot each latching arrangement from an engagement position suitable for contacting a wafer carried by its associated pocket to a disengaged position free from contacting the wafer.

The latching arrangement is pivotally mounted to the turret for rotation about an axis that is substantially parallel to the surface of a wafer held within its associated pocket. The pivot point about which the latch rotates is substantially adjacent the edge of the wafer but spaced apart from the wafer plane. The latch has a cam follower portion for engaging the actuator, a wafer engaging portion for pressing against the side of a wafer, and biasing means for urging the cam follower towards the engagement position. The holders and the latching arrangements preferably cooperate to hold wafers of various sizes.

In one of the preferred embodiments, each pocket includes a rim and the support means includes a plurality of holders carried by the rim. Each holder may take the form of a pair of spaced apart tubing elements. The wafer engaging portions preferably include a notch adapted to engage the wafer carried by their associated pocket. The notch serves to increase the grip of the latching arrangement.

BRIEF DESCRIPTION OF THE DRAWINGS

The features of the present invention that are believed to be novel are set forth with particularity in the appended claims. The invention, together with further objects and advantages thereof, may best be understood by reference to the following description taken in conjunction with the accompanying drawings in which:

FIG. 1 is an elevational view of a vertically mounted turret.

FIG. 2 is an enlarged sectional view of the turret through a pocket holding a wafer and showing an alternative pivotal retention device.

FIG. 3 is a side view of the pocket shown in FIG. 2 retaining a relatively small wafer.

FIG. 4 is a side view of the pocket shown in FIG. 2 retaining a relatively large wafer.

FIG. 5 is a side view of the pocket shown in FIG. 3 with the latch disengaged.

FIG. 6 is an enlarged view of the pocket shown in FIG. 2.

DETAILED DESCRIPTION OF THE DRAWINGS

In the embodiment of the wafer retention system, used for the purpose of illustration, the wafer stripping machine includes a housing 3 (not described herein in detail but described in the related application referenced above which is incorporated herein by reference). The housing 3 has a vertically disposed turret rotatably coupled to thereto. Referring initially to FIGS. 1 and 2, the turret 5 has a multiplicity of pockets 8 sized and shaped to receive a semiconductor wafer 10. The housing has an arcuate opening adjacent a selected section of the turret to accommodate the insertion of wafers into the pockets. A motor (not shown) is provided to turn the turret in increments equivalent to the pocket spacing. Thus, each time the turret is incremented, a new pocket comes into registry with the opening allowing for the removal of the processed wafer and the insertion of a new wafer. As best shown in FIGS. 2 and 6, each pocket has a rim 12 that surrounds a circular wafer opening 13 in the pocket. A plurality of catch arrangements 14 are arranged at various points about the rim surrounding each wafer opening 13. The catch arrangements 14 cooperate with a latch 22 pivotally mounted to the rim 12 to hold a wafer 10 in place. An actuator 28 is arranged to cooperate with the latch 22 to move it back and forth from an open position wherein the latch does not contact the wafer to a closed position, wherein the latch holds the wafer in place.

As best seen in FIGS. 3-5, each catch arrangement includes a support block that is secured to the rim by a pair of screws and a pair of tubular members 20 which extend into the wafer opening 13. The tubular members are spaced far enough apart to receive a wafer 10 therebetween. The tubular members cooperate with latch 22 to hold a wafer within the pocket. The latch is attached to the rim 12 adjacent the periphery of the turret to facilitate the introduction of wafers through the housing opening. To minimize the area on the wafer that is contacted by the tubular elements, they are only placed on a semicircular portion of the rim located opposite the latch. In the embodiment shown, four tubular member pairs 20 are used.

The latch 22 is pivotally mounted to a trunnion which is secured to the rim 12. The latch is moveable between a closed position and an open position. In the closed position, the latch engages a wafer 10 held within the pocket 8. In the open position, the latch is free from contacting the wafer. The latch pivot point is positioned directly adjacent the outer edge of a selected standard sized wafer when the wafer is fully received by the pocket. As can be seen in FIGS. 3-5, the latch is mounted so that it rotates within a plane that is orthogonal to the face of the wafer and the pivot point spaced apart from the plane that encompasses the face of the wafer. As will be described below, such positioning of the pivot point allows a compact pivot design to work with a variety of different sized wafers.

An actuator 26 is mounted to the housing 3 directly opposite the latch 22. The actuator has a linearly actuatable shaft 28 that moves between a retracted position and an extended position. In the retracted position, the shaft does not contact the latch 22, as seen in FIGS. 3 and 4. In the extended position the shaft 28 engages the latch to pivot it into the disengaged position. A plunger stopper 29 is attached to the shaft 28 of actuator 26 in order to insure that the shaft does not overextend thereby driving either the contact end of the latch or the shaft itself into the wafer.

The latch 22 is supported by a rod which is coupled to the trunnion on its opposite ends. The latch has a contact portion 31 for engaging the actuator 26 and a wafer engaging portion 33 disposed opposite the contact portion for engaging the wafer. The wafer engaging portion includes a notch 35 at the point of contact with the wafer. As can be best seen in FIGS. 3-5, the notch is substantially V-shaped. Since the pivot point 30 is positioned substantially below the outermost edge of a standard sized wafer, the edge of the wafer will remain within the notch over relatively wide variations in wafer sizes. As can be seen by contrasting FIGS. 3 and 4, the shape of the notch helps insure that the latch will maintain a good grip on the wafer over its entire operable range. It should be appreciated that although the notch is shown to be V-shaped, a wide variety of other geometries could be used as well.

Although only one embodiment of the present invention has been described herein, it should be understood that the present invention may be embodied in many other specific forms without departing from the spirit or scope of the invention. Particularly, it should be appreciated that the actual geometry of the latch and its placement can be varied widely. The rim arrangement could be eliminated altogether and the catch arrangements could be mounted on the turret directly. Additionally, the wafer retention device could be used for wafer processing machines other than the stripping machine described. Further, the actuator mechanisms can be widely varied and multiple actuators could be provided for a single turret. Therefore, the present example is to be considered as illustrative and not restrictive, and the invention is not to be limited to the details given herein, but may be modified within the scope of the appended claims.

We claim:

1. An apparatus for stripping materials from a wafer, the apparatus comprising a housing, an actuator means and a turret rotatably coupled to the housing for rotation about a selected axis, the turret being formed with a plurality of pockets, each pocket being shaped to hold a wafer, the flat surface of a wafer within the pocket defining a wafer surface plane and wherein each pocket includes:
   support means disposed about the periphery of the pocket for supporting the retained wafer; and
   a latching member pivotally coupled to the turret for rotation about an axis that is substantially parallel to the wafer surface plane at a pivot point spaced apart from the wafer surface plane substantially adjacent the edge of the wafer, the latching member including a cam follower portion for engaging the actuating means, a wafer engaging portion for pressing against the side of a wafer carried by the associated pocket, and biasing means for urging the cam follower towards the engagement position; and
   wherein the actuator means is arranged to independently pivot the latching member from an engagement position suitable for contacting a wafer carried by the pocket to a disengaged position free from contacting the wafer.

2. An arrangement as recited in claim 1 wherein the support means and the latching member cooperate to engage wafers of various sizes.

3. An arrangement as recited in claim 2 wherein each pocket includes a rim and said support means includes a plurality of clips carried by the rim.

4. An arrangement as recited in claim 3 wherein each clip includes a pair of spaced apart tubing elements.

5. An arrangement as recited in claim 4 wherein said actuator means includes a linearly actuatable plunger.

6. An arrangement as recited in claim 2 wherein the wafer engaging portions each include a notch adapted to engage the wafer carried by their associated pocket.

7. An arrangement as recited in claim 5 wherein biasing means each include a spring element.

8. An arrangement as recited in claim 4 wherein the clips are disposed opposite the latching member.

9. An apparatus for stripping materials from a wafer comprising a housing, an actuator mechanism and a turret rotatably coupled to the housing for rotation about a selected axis, the turret being formed with a plurality of pockets, each pocket being shaped to receive a wafer, the flat surface of a wafer within the pocket defining a wafer surface plane, each said pocket having a rim surrounding the pocket and including:
- a plurality of holder arrangements carried by the pocket's rim, each said holder arrangement including a pair of spaced apart tubing elements;
- a latching member that cooperates with said holder arrangements to hold variably sized wafers within the pocket, the latching member being pivotally coupled to the turret for rotation about an axis that is substantially parallel to the wafer surface plane to provide movement between a position of engagement with a wafer disposed within the pocket to a disengaged position free from contacting the wafer, the pivot point being spaced apart from the wafer surface plane substantially adjacent the edge of the wafer, the latching member including a cam follower portion for engaging the actuator mechanism, a wafer engaging portion having a notch for pressing against the side of a wafer, and a spring element for urging the latching member into the engagement position;
- wherein the actuator mechanism is arranged for selectively pivoting the latching member from its engagement position to its disengaged position.

* * * * *